(12) United States Patent
    Calcaterra et al.

(10) Patent No.: US 10,997,324 B2
(45) Date of Patent: *May 4, 2021

(54) MAPPING CIRCUITS

(71) Applicant: International Business Machines Corporation, Armonk, NY (US)

(72) Inventors: Jeffrey A. Calcaterra, Chapel Hill, NC (US); Humberto Gutierrez-Rivas, Chapel Hill, NC (US); Steven M. Miller, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 180 days.

This patent is subject to a terminal disclaimer.

(21) Appl. No.: 16/041,726

(22) Filed: Jul. 20, 2018

(65) Prior Publication Data

US 2018/0336292 A1    Nov. 22, 2018

Related U.S. Application Data

(60) Continuation of application No. 14/596,686, filed on Jan. 14, 2015, now Pat. No. 10,055,515, which is a division of application No. 12/122,453, filed on May 16, 2008, now Pat. No. 9,552,446.

(51) Int. Cl.
    *G01R 15/00*     (2006.01)
    *G06F 30/13*     (2020.01)
    *G01R 19/25*     (2006.01)
    *G01R 31/69*     (2020.01)

(52) U.S. Cl.
    CPC ......... *G06F 30/13* (2020.01); *G01R 19/2513* (2013.01); *G01R 31/69* (2020.01)

(58) Field of Classification Search
    CPC ..... G06F 30/13; G01R 31/69; G01R 19/2513; G01R 31/3277; H02G 3/00; H04L 12/00; H02H 3/00; H02H 3/38; G05B 15/02
    USPC .......................................................... 702/57
    See application file for complete search history.

(56) References Cited

U.S. PATENT DOCUMENTS

| 3,623,142 | A | 11/1971 | Key |
| 4,121,152 | A | 10/1978 | Hale et al. |
| 4,734,638 | A | 3/1988 | Weber |
| 4,801,868 | A | 1/1989 | Brooks |
| 4,906,938 | A | 3/1990 | Konopka |

(Continued)

FOREIGN PATENT DOCUMENTS

WO    WO-9906892 A1 *  2/1999    ......... G05B 23/0262

OTHER PUBLICATIONS

English Abstract of CN 203443924, Feb. 19, 2014. (Year: 2014).*

(Continued)

*Primary Examiner* — Michael P Nghiem
(74) *Attorney, Agent, or Firm* — William H. Hartwell

(57) ABSTRACT

Multiple modules are installed, with each module installed in one of multiple outlets to be mapped. A probe is triggered to propagate a signal that provides circuit information at one of multiple circuit interrupts, where the signal is detectable by any of the modules connected by a single circuit to the one circuit interrupt from which the signal is propagated. The circuit information is retrieved from any of the modules that detected the signal as an indication that the modules from which the circuit information is retrieved are connected to the single circuit.

20 Claims, 6 Drawing Sheets

(56) References Cited

U.S. PATENT DOCUMENTS

| | | | |
|---|---|---|---|
| 5,109,200 | A | 4/1992 | Dushane et al. |
| 5,222,358 | A | 6/1993 | Chaput et al. |
| 5,270,658 | A | 12/1993 | Epstein |
| 5,331,283 | A | 7/1994 | Sheldon |
| 5,352,985 | A | 10/1994 | Simon |
| 5,422,564 | A | 6/1995 | Earle et al. |
| 5,493,206 | A | 2/1996 | Boons |
| 5,497,094 | A | 3/1996 | George |
| 5,699,051 | A | 12/1997 | Billig et al. |
| 5,812,352 | A | 9/1998 | Rokita et al. |
| 5,969,516 | A | 10/1999 | Wottrich |
| 6,054,931 | A | 4/2000 | Wottrich |
| 6,072,317 | A | 6/2000 | Mackenzie |
| 6,154,032 | A | 11/2000 | Coia et al. |
| 6,163,144 | A | 12/2000 | Steber et al. |
| 6,166,532 | A | 12/2000 | Coia et al. |
| 6,297,729 | B1 | 10/2001 | Abali et al. |
| 6,360,177 | B1 | 3/2002 | Curt et al. |
| 6,392,395 | B2 | 5/2002 | Roberts et al. |
| 6,466,029 | B2 | 10/2002 | Stroth et al. |
| 6,798,209 | B2 | 9/2004 | Lavoie et al. |
| 6,933,712 | B2 | 8/2005 | Miller et al. |
| 7,030,624 | B1 | 4/2006 | Love |
| 7,057,401 | B2 | 6/2006 | Blades |
| 7,157,896 | B2 | 1/2007 | Konopka |
| 7,167,078 | B2 | 1/2007 | Pourchot |
| 7,274,184 | B1 | 9/2007 | McCasland et al. |
| 8,018,219 | B2 | 9/2011 | Calcaterra et al. |
| 9,552,446 | B2 * | 1/2017 | Calcaterra .......... G01R 19/2513 |
| 10,055,515 | B2 * | 8/2018 | Calcaterra .......... G01R 19/2513 |
| 2002/0195495 | A1 | 12/2002 | Melick et al. |
| 2005/0017846 | A1 | 1/2005 | Butler et al. |
| 2005/0060107 | A1 * | 3/2005 | Rodenberg, III ...... G01R 22/00 702/62 |
| 2005/0141431 | A1 | 6/2005 | Caveney et al. |
| 2005/0212526 | A1 | 9/2005 | Blades |
| 2006/0238363 | A1 | 10/2006 | Johnson |
| 2007/0155349 | A1 | 7/2007 | Nelson et al. |
| 2009/0164824 | A1 | 6/2009 | Langgood et al. |
| 2009/0248329 | A1 | 10/2009 | Restrepo |
| 2009/0278524 | A1 | 11/2009 | Calcaterra et al. |
| 2010/0145542 | A1 | 6/2010 | Chapel et al. |
| 2011/0210717 | A1 | 9/2011 | Hilton |
| 2015/0127305 | A1 | 5/2015 | Calcaterra et al. |
| 2016/0202340 | A1 | 7/2016 | Maguire et al. |

OTHER PUBLICATIONS

Author Unknown, CF12 Pro Circuit Finding Kit, Zircon.com, Mar. 17, 2006, pp. 1-2, Retrieved from archived website at: http://web.archive.org/web/20060317171839/http://www.zircon.com/SellPages/ScanAndSensor/CF12pro/PDS/CF12pro_PDS.html.

United States Patent and Trademark Office, Office Action for U.S. Appl. No. 12/122,453, dated Mar. 17, 2011, pp. 1-14, Alexandria, VA, USA.

United States Patent and Trademark Office, Office Action for U.S. Appl. No. 12/122,453, dated Oct. 18, 2011, pp. 1-12, Alexandria, VA, USA.

United States Patent and Trademark Office, Advisory Action for U.S. Appl. No. 12/122,453, dated Jan. 27, 2012, pp. 1-6, Alexandria, VA, USA.

United States Patent and Trademark Office, Examiner's Answer for U.S. Appl. No. 12/122,453, dated May 21, 2012, pp. 1-13, Alexandria, VA, USA.

United States Patent and Trademark Office, Decision on Appeal for U.S. Appl. No. 12//122,453, dated Sep. 11, 2014, pp. 1-5, Alexandria, VA, USA.

United States Patent and Trademark Office, Notice of Allowance for U.S. Appl. No. 12/122,453, dated Oct. 3, 2014, pp. 1-10, Alexandria, VA, USA.

United States Patent and Trademark Office, Office Action for U.S. Appl. No. 12/122,453, dated Jun. 26, 2015, pp. 1-11, Alexandria, VA, USA.

United States Patent and Trademark Office, Office Action for U.S. Appl. No. 12/122,453, dated Nov. 23, 2015, pp. 1-12, Alexandria, VA, USA.

United States Patent and Trademark Office, Advisory Action for U.S. Appl. No. 12/122,453, dated Feb. 12, 2016, pp. 1-4, Alexandria, VA, USA.

United States Patent and Trademark Office, Notice of Allowance for U.S. Appl. No. 12/122,453, dated Sep. 16, 2016, pp. 1-9, Alexandria, VA, USA.

United States Patent and Trademark Office, Office Action for U.S. Appl. No. 14/596,686, dated Jul. 27, 2017, pp. 1-36, Alexandria, VA, USA.

United States Patent and Trademark Office, Office Action for U.S. Appl. No. 14/596,686, dated Jan. 8, 2018, pp. 1-12, Alexandria, VA, USA.

United States Patent and Trademark Office, Notice of Allowance for U.S. Appl. No. 14/596,686, dated Apr. 20, 2018, pp. 1-13, Alexandria, VA, USA.

* cited by examiner

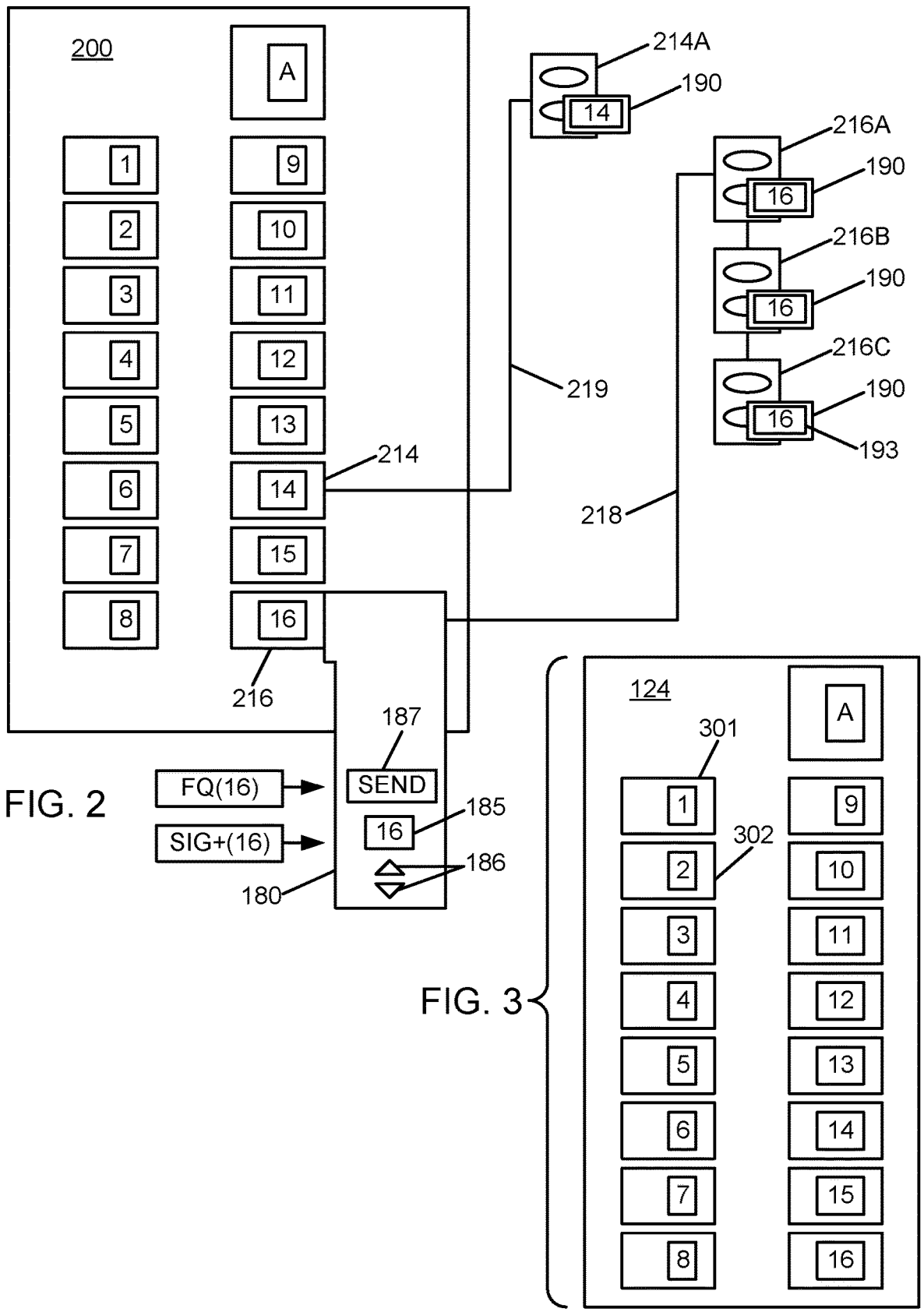

MAPPING CIRCUITS

FIELD OF THE INVENTION

The invention relates to the field of electrical power and more particularly to a system method and program product for mapping electrical circuits.

BACKGROUND

Electricians typically require a variety of information about outlets before performing work on them, such as replacing an outlet, adding a new outlet to a circuit, and other electrical work. An electrician might use a variety of tools to acquire the necessary information. This information may include the circuit number that an outlet is on, and possibly the outlet number and other information such as voltage, amperage, polarity, and the like. The electrician might also like to collect information such as the amount of power consumed over a period of time, voltage peaks, and other relevant electrical information about the outlet and/or the circuit.

Circuits are currently mapped using one of two methods. The first method is to flip the switches on a circuit breaker while a second person waits in a room where an outlet (or switch) is located with a light or other load on the outlet. The second person yells when the light or other load goes out due to loss of power, indicating that the switch just flipped is for the circuit that the outlet is on. The second person then moves the light or other load to another outlet, and the process is repeated. This approach requires no technology, but it is very time consuming. In older houses or other buildings, all of the outlets in a room may not be on the same circuit, since electricians or homeowners adding additional service might just tap the nearest wire rather than trying to tap the circuit that corresponds to the other outlets in the same room. Moreover, this approach requires two people to be practical. Also, this method does not provide information about voltage, amperage, polarity, power consumption, voltage peaks or any other characteristic that might be relevant.

A second method that is currently used for mapping electrical circuits comprises a commercially available device used to map one outlet at a time. This method comprises using a device that sends a signal over the electrical wiring from an outlet to the circuit breaker. The electrician then moves a detector over the circuit breakers in a circuit box until it picks up the signal as it passes over the correct circuit breaker. The device typically lights up or emits a tone to indicate that the signal is picked up and that the current circuit breaker corresponds to the circuit for the outlet being tested. While this second approach can detect a circuit for one outlet, it is not practical for multiple outlets on multiple circuits. This is because the detectors do not differentiate between the signals sent from two different signal modules. Thus, if an electrician was to plug in multiple modules, and they were on different circuits, there would be no way to differentiate between the modules/outlets.

A method for collecting information about different outlets and consolidating the information into a hand-held computer is described in U.S. Pat. No. 7,057,401. This approach allows a technician to collect signals from multiple modules in parallel, but this approach is cumbersome, requiring that the outlets and circuit box be connected by an additional wire ("umbilical cord") that needs to be carried around the worksite. Moreover, this approach is expensive, due to the computer and the umbilical cord.

U.S. Pat. No. 6,466,029 provides a method for detecting the correct circuit interrupt device for a particular circuit by applying a signal generator at an outlet and sweeping a signal detector over circuit interrupt devices. This method only allows for one to one correlation of an outlet and a fuse or circuit breaker. Similarly, U.S. Pat. No. 5,493,206 provides a method and apparatus for determining a group to which a connection point forming part of an electrical installation belongs by installing a detector in place of a fuse and generating a signal at a connection point. This method is limited by the scalability of the number of connections that can be made simultaneously to the fuse box.

A method for determining which outlet is closer to a circuit breaker is described in U.S. Pat. No. 5,352,985. In this method a device measures a voltage drop over a wiring loop between neutral and earth contact terminals. This approach, however, only tells the electrician about the relative proximity to the circuit breaker after he knows that they are on the same circuit.

In addition to circuit detection, there are devices that can collect other types of information such as voltage, polarity, etc., but they are typically specialized so that multiple tools and some manual steps are required to completely map out the outlets and their characteristics and to relate them to circuits in the breaker box.

Currently, keeping track of outlets to circuit relationships on a large scale requires significant manual work. Relating the circuit identification for each outlet to the map requires manual work. Relating circuit identifications to the circuit box requires manual work. Also, each time a measurement is taken to provide information like voltage, etc; manual work is required to relate the information to the outlets on a map. Moreover, current mapping methods do not relate a circuit box representation and a floor plan to provide a comprehensive circuit map.

SUMMARY

A method, apparatus and program product are provided for mapping electrical circuits. According to an exemplary embodiment, a user provides an electronic record of one or more rooms with outlets to be mapped and installs a module in each outlet to be mapped. Using an interactive program, the user prepares a diagram of a circuit box. The user triggers a probe to propagate a signal detectable by said modules over a circuit and to provide circuit information. The user retrieves the circuit information from the modules. Then, the interactive program associates the circuit information from each module with a corresponding outlet on said electronic record of one or more rooms.

The apparatus, according to an exemplary embodiment, comprises a probe, a computer operably associated with the probe, one or more modules installed in outlets to be mapped, and a program of instruction executed by the computer. The probe is adapted to send a signal over a selected circuit and provide circuit information, including circuit identification. The modules have a connector for electrically connecting to an outlet, logic interconnected with the connector detecting the signal and receiving the circuit information, and an indicator interconnected with the logic presenting the circuit information in response to the signal. The computer is operably associated with the probe and configured to execute the program of instructions to provide a breaker box representation and a electronic record of one or more rooms showing outlet symbols identifying the location of outlets and to collect the circuit information from the one or more modules and associate the circuit information with a corresponding breaker on the breaker box representation and on outlet symbols on the electronic record of one or more rooms of one or more rooms.

BRIEF DESCRIPTION OF THE DRAWINGS

The features and advantages of the invention will be more clearly understood from the following detailed description of the preferred embodiments when read in connection with the accompanying drawing. Included in the drawing are the following figures:

FIG. 2 is a front view of a circuit box or breaker box showing a probe over a breaker switch to send a signal over a circuit according to an exemplary embodiment of the present invention;

FIG. 3 is a representation of the breaker box of FIG. 2 according to an exemplary embodiment of the present invention;

DETAILED DESCRIPTION

Figure 1A:
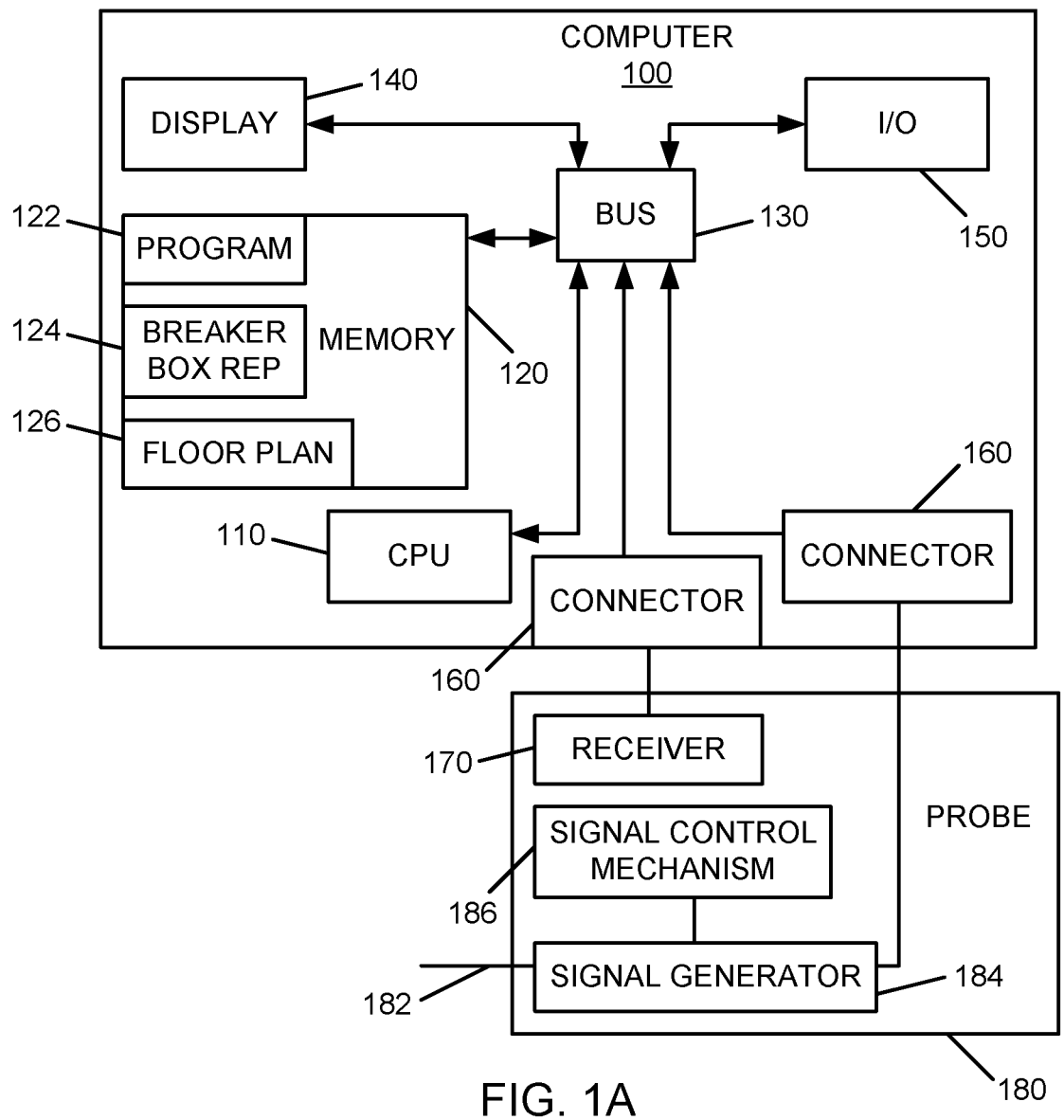
FIGS. 1A and 1B are block diagrams of a computer and probe and a module, respectively of a system for mapping electrical circuits according to an exemplary embodiment of the present invention.
Figure 1B:
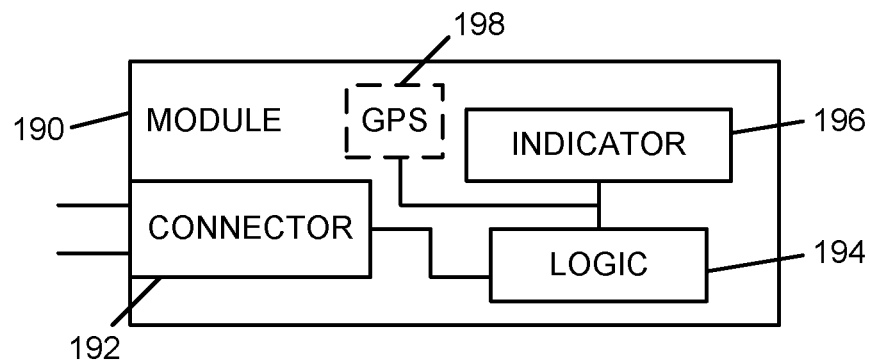

According to an exemplary embodiment, the present invention provides a method, apparatus and program product for mapping electrical circuits. As shown in FIG. 1, an exemplary apparatus comprises a computer 100 executing a program of instruction 122 and a probe 180 interconnected to the computer 100.

The computer 100 may be a personal computer (PC) a hand held computing device such as a personal digital assistant (PDA) or any other computer or computing device suitable for executing an interactive program of instruction 122 and displaying representations of a breaker box 124 and a floor plan 126 or other record of one or more rooms.

In an exemplary embodiment, computer 100 comprises a processing unit 110 interconnected with a memory 120. Processing unit 110 and memory 120 may be interconnected through a bus 130 or any other suitable means for electronic interconnection. A display 140 and one or more input/output devices 150 may also be interconnected with the processing unit 110. The display may be an integral display or a separate component interconnected to the processing unit either directly or through bus 130. The display 140 may be, for example, a liquid crystal display or any other display suitable for presenting a representation of a breaker box and a floor plan. Input/output devices 150 may comprise a keypad, mouse and/or any other device suitable for entering data into computer 100.

The program of instruction 122 may be stored on memory 120 as illustrated in FIG. 1. Alternatively the program of instruction may be retrieved from a memory device such disc, flash drive or other media or it may be retrieved over a network or the like. Similarly, representations of the breaker box 124 and the floor plan 126 may be stored in memory 120, on another memory (not shown), or remotely.

The illustrated exemplary apparatus also has a probe 180 interconnected to the processing unit 110 either directly or through bus 130 or the like. Probe 180 comprises a tip 182 configured to electrically couple to a breaker in a breaker box to propagate a signal over an electrical circuit. The probe 180 may be electrically coupled to the circuits by induction. Alternatively, direct physical contact may be made between the probe and the circuit, or the probe may communicate through a wired or wireless connection to a third device connected to the circuit.

The probe 180 also comprises a signal generator 184 which generates a signal that can be detected on an electrical circuit at an outlet or other connection point, such as a switch. The signal may be, for example, a frequency change, modulation, one or more pulses, data packets, timing, a generic signal that causes a module to generate a time stamp, or any other signal suitable for propagation over an electrical circuit and provision of a means of identification. The signal generated by signal generator 184 may be set by control mechanism 186. Signal control mechanism 186 may be for example up and down buttons interconnected to a microprocessor configured to create a data packet containing various numbers, such as 1 through 16, corresponding to different circuits. In an alternate embodiment, the signal control may be provided in computer 100 with the computer electrically connected to probe 180 through a connector 160. In another alternate embodiment the signal generator may be in computer 100 and the signal may be transmitted to probe 180 through a connector 160. In yet another exemplary embodiment, probe 180 may be wirelessly connected with computer 100.

By means of the electrical coupling with an electrical circuit, the probe propagates a signal through the tip 182 and over the wiring of the electrical circuit. Modules 190 (as shown in FIG. 1A) are electrically coupled to the electrical circuit, such as by being plugged into outlets on the electrical circuit being probed. The modules 190 comprise a connector 192 adapted to electrically couple to a circuit. In the illustrated exemplary embodiment, connector 192 is a male electrical plug adapted to mate with a standard electrical outlet. In alternative embodiments, the connector may be adapted to couple to other points in an electrical circuit, such as a switch by means of inductance, for example.

The modules 190 also comprise an indicator 196 which may be one or more light emitting diodes (LEDs) a display, an RF transmitter, or any other means suitable for presenting or transmitting an indication that a signal has been received. According to an exemplary embodiment, the indication provided by indicator 196 comprises an identification of the circuit conveyed in the signal. For example, indicator 196 may display a numeral corresponding to a circuit that was conveyed in the signal propagated from the probe 180. Alternatively, indicator 196 may comprise a plurality of LEDs corresponding to various circuits and an LED wherein an LED corresponding to a circuit and the signal is illuminated. According to another alternative embodiment, indicator 196 may be an RF transmitter transmitting data corresponding to an identification conveyed in the propagated signal. For example, if the signal is propagated on the circuit of a first breaker, the signal might comprise a modulation, data packet, etc corresponding to or containing the number 1. The indicator might then be an RF transmitter transmitting a data packet containing the number 1. An LED may indicate that the outlet has been mapped using a transmission such as an RF transmission.

The modules 190 may also comprise logic 194 which may comprise any combination of hardware and software adapted to differentiate the propagated signal and cause a corresponding indication at indicator 196. Logic 194 may be, for example, a microprocessor programmed to identify one of various signals and send data corresponding to the signal to the indicator 196 to be displayed.

According to an exemplary embodiment, a receiver 170 is connected to computer 100 through a connector 160. If the indicator is an RF transmitter, for example, receiver 170 may be an RF receiver adapted to receive the RF transmission of a signal identification, such as a number corresponding to the circuit on which the signal is propagated. Alternatively, the indicator may be a display programmed to display a bar code corresponding to the identification in the propagated signal, and the receiver 170 may be a bar code scanner. Thus, the receiver 170 may be used to provide information from modules about the propagated signal to the program of instruction 122.

As shown in FIG. 2, probe 180 is placed in position over a circuit breaker 216 in circuit breaker box 200. The probe is set to a signal corresponding to the corresponding circuit 218. This may be accomplished, for example, by pressing control buttons 186 until an indicia 16 corresponding to the selected circuit breaker 216 is displayed on a display 185. A trigger mechanism 187, such as a send button is activated to cause the signal generator 184 to propagate a signal through tip 182 (see FIG. 1A) into the electrical circuit 218 of the chosen circuit breaker 216 to outlets 216A, 216B, and 216C and into modules 190 plugged into the outlets 216A, 216B, 216C. The signal is received and identified by modules 190 causing each module 190 on the chosen circuit to display an indicia 16 on indicator 193. Similarly, the indicia 14 is displayed on a module 190 plugged into outlet 214A corresponding to the circuit breaker 214 for the circuit 219 of outlet 214A.

Program of instruction 122, when executed by processor 110, creates a representation 124 of a circuit breaker box 200. This representation 124 indicates the breakers present in the breaker box 200 and corresponding indicia (e.g., 1-16). Main switch A, 220 volt breakers (not shown), and any double switches (not shown) are also indicated. According to an exemplary embodiment, program of instruction 122 guides a user through the process of creating representation 124 through questions presented in a dialog box or the like. The process of creating the representation will be described in detail below.

Program of instruction 122 also collects data from modules 190 after one or more signals have been propagated over the various circuits corresponding to breakers 1-16 in circuit box 200. This data may then be presented on a floor plan 126 of one or more rooms having outlets and/or switches on electrical circuits of interest. The floor plan 126 may be retrieved from a blueprint uploaded from a data storage device, created from a rough sketch scanned into computer 100, created through use of a computer aided drafting (CAD) program, or any other suitable means for providing a layout of one or more rooms and the outlets and/or switches therein.

According to an exemplary embodiment of the present invention, a method is provided for mapping electrical circuits. A floor plan 126 is retrieved or provided as described above. A user then physically locates outlets and/or switches of interest (step 510). For example, the user may look in one or more rooms where electrical work is to be performed.

The user indicates the locations of the outlets and or switches on the floor plan 126 (step 520). This may be accomplished, for example, by program of instruction 122 providing a menu having a locate outlet function. The user selects the locate outlet function from the menu and performs a function such as a right mouse click to add an outlet symbol onto the floor plan at the designated location. Alternatively, an outlet symbol may be placed on the floor plan using a click and drag technique or any other means suitable for placing a symbol onto a graphical image.

The user creates a representation 124 of a circuit breaker box 200 for the building/rooms to be mapped (step 530). According to an exemplary embodiment, the representation 124 is created interactively using the program of instruction 122. This may be accomplished, for example, by the user providing a few simple parameters to the program of instruction 122. These parameters may include, for example, the number of columns of circuit breakers or fuses in the breaker box 200 and how many breaker switches are in each column. The program of instruction 122 may provide questions through a dialog box or provide a menu of options for entering the parameters. The user adjusts the representation 124 to identify additional parameters such as 220 volt breaker switches, double switches, unused slots, and the like. The program of instruction 122 may prompt the user to identify 220 volt breakers, double switches, and unused slots, or the user may select these parameters from a menu or any other means for identifying parameters of the breaker box 200 and indicating them on the representation 124 may be used. For example, as shown in FIG. 3, the program of instruction 122 may show a first representation 301 for a first circuit breaker, a second representation 302 for a second circuit breaker, and similarly show representations for each other circuit breaker in the breaker box 200 on representation 124 of the circuit box 200.

The user then electrically couples modules 190 with outlets and/or switches to be mapped (step 540). According to an exemplary embodiment, the modules 190 have connectors 192 are a male electrical plug which can be coupled with an outlet by inserting the connector into the outlet. The modules comprise a means for identifying the circuit that they are on. According to an exemplary embodiment, this means may comprise an indicator 196 which may be a display, for example, displaying an indicia, such as a number corresponding to the circuit that the module is connected to, further corresponding to the numbering of a breaker switch in the breaker box representation 124. The module 196 may acquire this number from the propagated signal. Each signal, as described above may contain a data packet comprising the circuit number for the circuit on which the signal was propagated, or the signal may be a signal predefined to correspond to a specific number propagated on the circuit corresponding to that number.

Alternatively, the circuit number may be stored in a memory (not shown) in module 190, and then retrieved by program of instruction 122. According to yet another alternative embodiment, each module 190 may comprise a clock synchronized with the other modules 190 and a clock in computer 100 or probe 180. The clock stops when the module receives a signal. The circuit may then be determined by matching the time on the stopped clock with the clock in the computer 100 or probe 180. The circuit number can then be determined by which signal was propagated at the time when the clock stopped.

The user sets the probe 180 to a first signal and couples the probe 180 to a first circuit (step 550). The probe 180 may be set to a first signal of a plurality of different signals by triggering control mechanism 186, or by any other means suitable for selecting and setting a specific signal, as described above. The probe 180 as described above is electrically coupled to a first electrical circuit by contact, inductance or any other suitable means.

The probe 180 is triggered (step 560), propagating the first signal over the first electrical circuit (a "single circuit"). The probe may be triggered by a triggering mechanism (not shown) on the probe itself, by a command from computer 100, or by any other means suitable for causing the probe to propagate a signal over an electrical circuit. The signal may contain an identification within the signal, such as by use of a data packet, or a modulation or other signal predefined to correspond to a specific circuit. Alternatively, the signal may be a generic signal causing modules 190 to record a timestamp or other indication. According to another alternative embodiment, a generic signal propagated over an electrical circuit may be accompanied by another signal containing an identification that is broadcast in another way, such as an RF signal or the like.

Optionally, the probe 190 may be set to a second signal and positioned to couple with another, additional electrical circuit (step 570). Then another signal may be propagated over the second electrical circuit (step 570). Program of instruction 122 may query the user after each signal is propagated whether to continue or end signal propagation (step 580). If the user indicates another additional circuit (or the program of instruction determines that there is another additional circuit based on the representation of the breaker box), then the program of instruction repeats steps 570 and 580. Optionally, program of instruction 122 may provide directions guiding the user through the steps of setting and propagating signals.

When signals have been propagated on each electrical circuit to be mapped, the user then collects data from the modules 190. First the user indicates which outlet (or switch) a module 190 is electrically coupled to (step 590). This may be accomplished for example by touching the outlet on the floor plan 126 on a touch screen interface. Alternatively, a mouse or other input device may be used to indicate the outlet. Optionally, program of instruction 122 may direct the user to indicate the outlet.

Once the correct outlet is indicated, the user inputs data from a module 190 in the indicated outlet into the program of instruction 122 (step 592). The data may comprise a circuit number or other circuit identification. The data may also comprise additional data such as peak voltage over a period of time, signal strength (which may be used to calculate distance or relative distance from the circuit breaker), and other useful electrical parameters. The program of instruction 122 then presents the data on floor plan 126.

The data may be input by any of a variety of methods. According to an exemplary embodiment, the data may be read off of an indicator 196 on the module 190 and manually input into the program of instruction 122, such as through a keyboard. Alternatively, the indicator 196 may provide an RFID signal or a bar code, and the data may be input by an appropriate receiver 170 connected to computer 100. In the examples of RFID and bar code, receiver 170 may be an RF receiver or bar code reader, respectively. According to an exemplary embodiment, receiver 170 is integral with probe 180.

Figure 6:
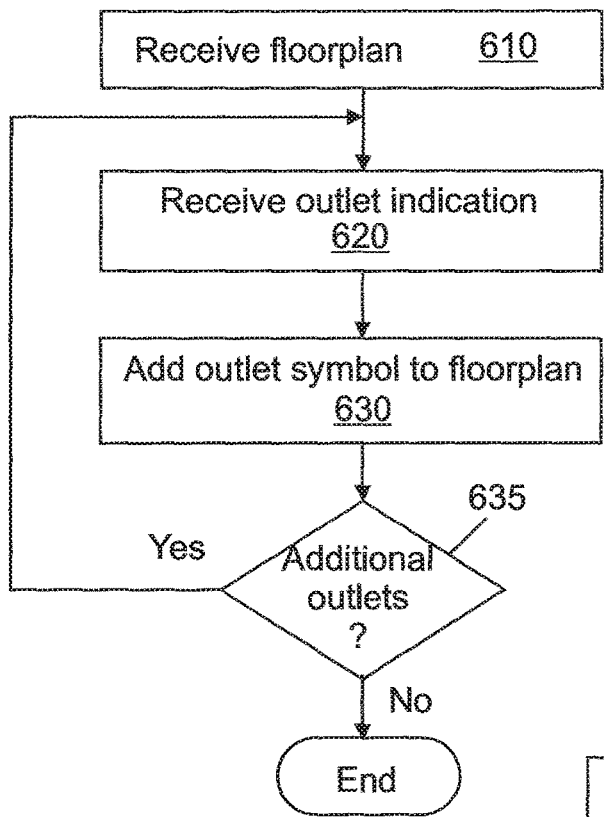
FIG. 6 is a flow diagram of a method for adding outlets to a floor plan for mapping electrical circuits according to an exemplary embodiment of the present invention.

FIG. 6 shows a method for adding outlets to a floor plan for mapping electrical circuits according to an exemplary embodiment of the present invention. The program of instruction receives a floor plan (step 610). As described above, the floor plan may be imported, created using a CAD or other graphics program, or scanned in from a rough sketch.

Next, the program of instruction receives an indication of an outlet location (step 620). As described above, this step may be accomplished by using a mouse, keyboard or other input device and may be menu driven. A user may add outlets to a specified location by picking and placing, dragging or any other technique for indicating where a graphic is to be placed.

Figure 4:
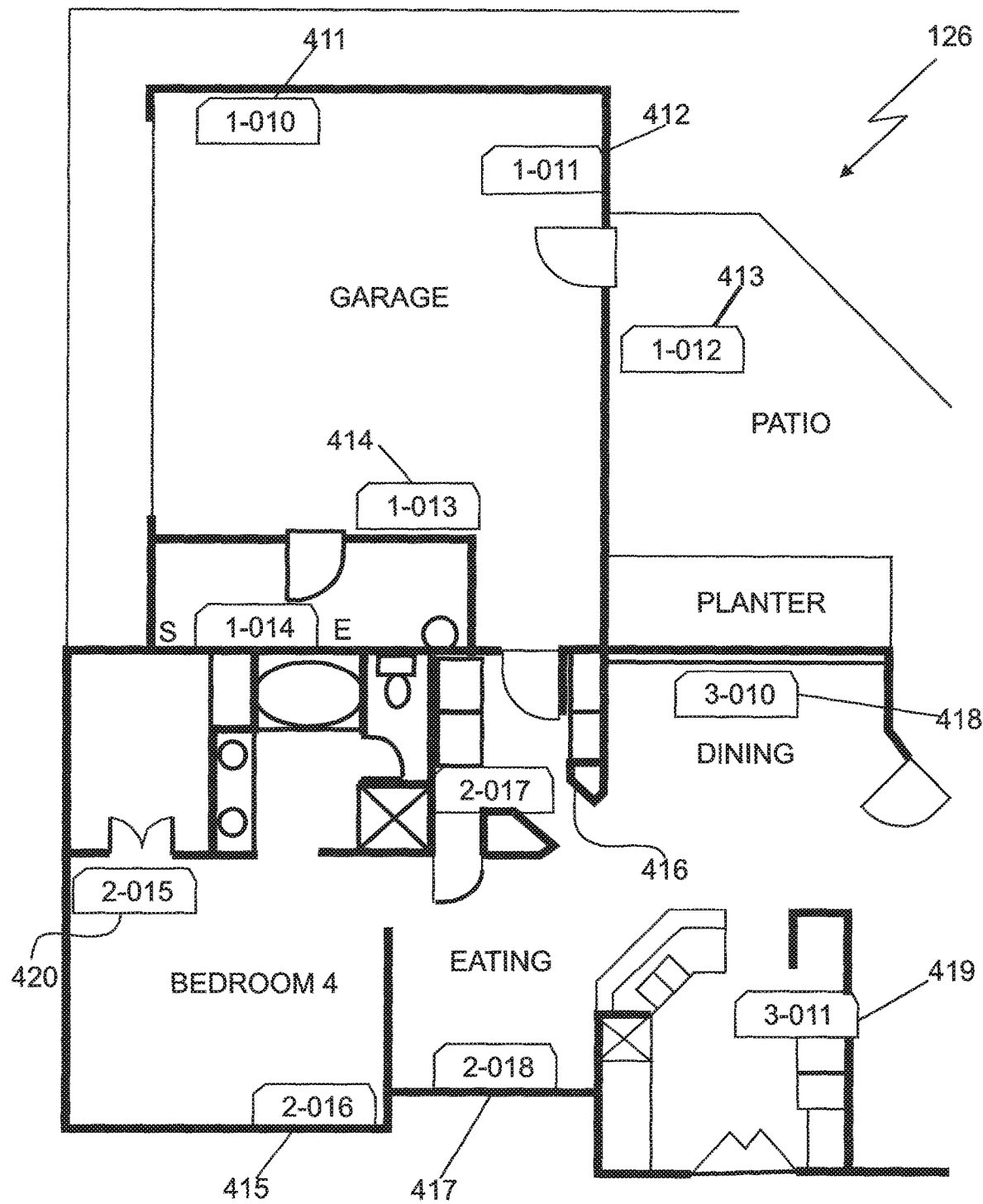
FIG. 4 is a representation of a floor plan showing outlets and their associated circuits according to an exemplary embodiment of the present invention.
Figure 5:
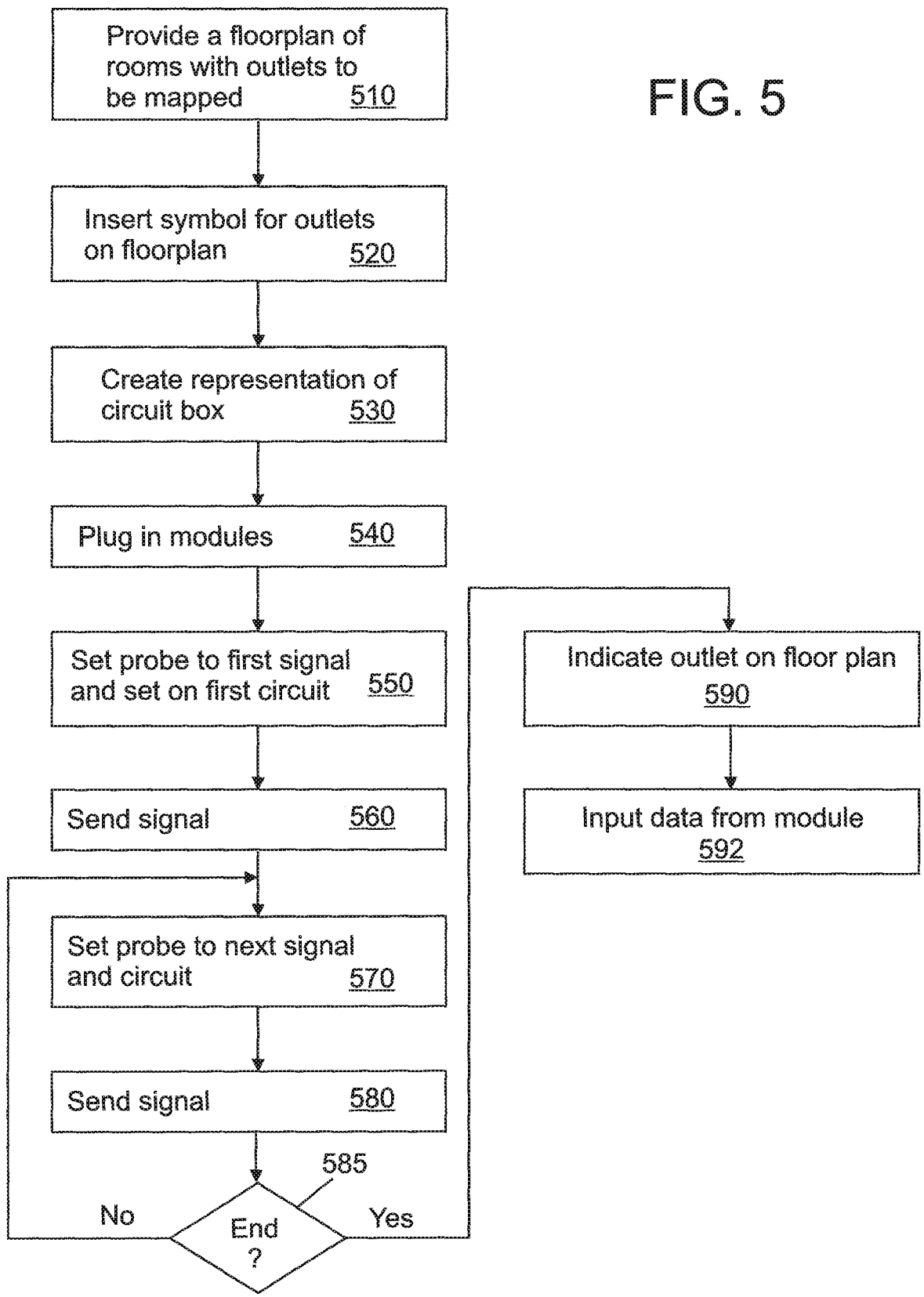
FIG. 5 is a flow diagram of a method for mapping electrical circuits according to an exemplary embodiment of the present invention.

In response to the indication of outlet location, the program of instruction 122 adds an outlet symbol 411-420 (in FIG. 4) to the indicated location (step 630). The program of instruction then determines whether or not there are more outlets to be mapped (step 635). This determination may be made by whether or not the user indicates another outlet or by the user's response to a query of whether or not there are additional outlets to be mapped, for example. If there are more outlets, then steps 620 and 630 are repeated for each additional outlet. If there are no additional outlets, the routine for adding outlets ends.

Figure 7:
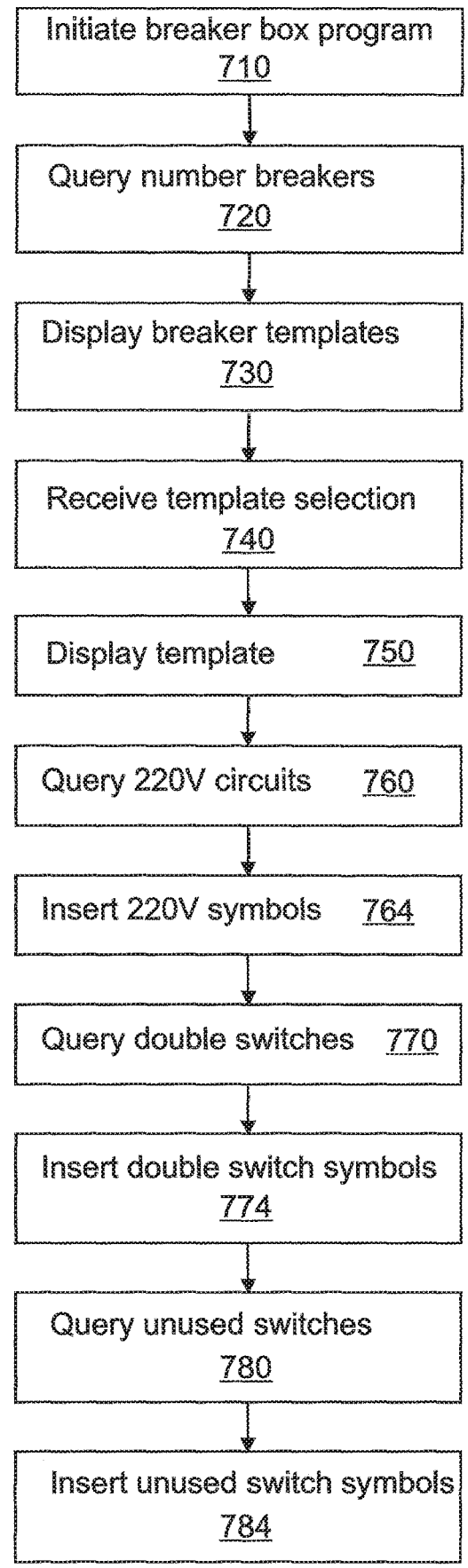
FIG. 7 is a flow diagram of a method for creating a representation of a circuit breaker box for mapping electrical circuits according to an exemplary embodiment of the present invention.

FIG. 7 shows a program routine for creating a representation of a circuit breaker box for mapping electrical circuits according to an exemplary embodiment of the present invention. The program of instructions 122 initiates a breaker box routine (step 710). This may be performed in response to a user selecting from a menu, in response to completion of a previous operation, or by any other suitable means.

According to an exemplary embodiment, the program of instructions 122 queries the user on the number of breaker switches (step 720). The query may be made in a dialog box or any other means suitable for retrieving data from a user. Upon receiving a numerical input of the number of breaker switches from the user, the program of instruction 122 displays one or more templates corresponding to the input number of breaker switches (step 730). The program of instruction 122 then receives a template selection from the user (step 740) and displays the selected template (step 750). The user may select a template by a mouse click while hovering over a template or by any other means suitable for selecting from a group of images.

The program of instruction 122 may then allow the user to make user initiated or menu driven adjustments to the selected template. According to an exemplary embodiment, the program of instruction queries the user whether or not there are any 220 volt circuits (step 760). Alternatively the user may initiate this determination using a drag down menu, for example. The user may indicate each 220 volt circuit by a mouse click while hovering on the breakers in the representation 124 or any other suitable selection means. In response to the user selection, a 220 volt symbol is inserted in the representation 124 at the indicated location (step 764).

Similarly, the program of instruction 122 may query the user whether or not there are any double switches (step 770), and if the user indicates double switches, the program of instruction inserts a double switch symbol at the designated location (step 774). The program of instruction 122 may also query the user whether or not there are any unused switches (step 780), and if the user indicates unused switches, the program of instruction inserts an unused switch symbol at the designated location (step 784).

Alternatively, the user may initiate the adjustments by hovering over a switch that is a 220 volt switch, a double switch, a GFCI switch, a surge protected switch, or any other enhanced function switch or unused switch. In response, the program of instruction 122 may provide a dialog box or menu allowing the user to select the appropriate adjustment. In response to the selection, the program of instruction 122 may insert the appropriate symbol at the present location.

Figure 8:
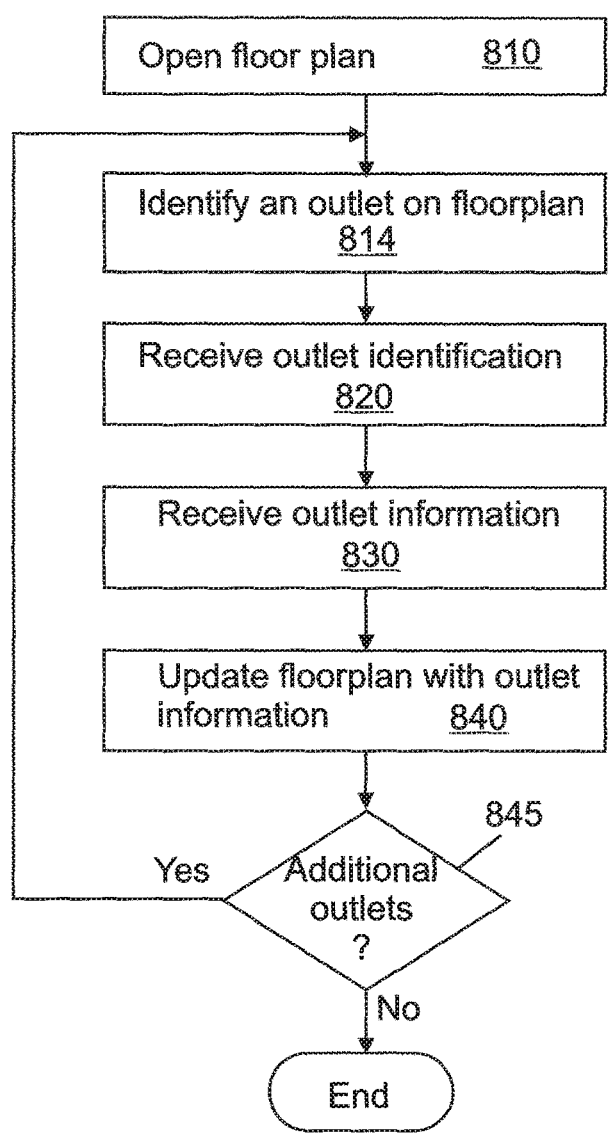
FIG. 8 is a flow diagram of a method for adding outlet information to outlet designations on a floor plan for mapping electrical circuits according to an exemplary embodiment of the present invention.

FIG. 8 shows a method for collecting data from the one or more modules 190. The program of instruction 122 opens the floor plan 126 in response to a user input or completion of propagating signals or any other suitable event (step 810). The floor plan is displayed on a monitor or display 140 of computer 100. In this embodiment, outlets are already located on the floor plan 126.

The user identifies an outlet on the floor plan 126 (step 814). According to an exemplary embodiment, the user approaches an outlet with a module 190 coupled to it. The user then indicates the corresponding outlet on the floor plan 126. The user may for example hover over the corresponding outlet on the floor plan 126 and indicate the outlet with a mouse click or other suitable identification means. The program of instruction 122 receives the outlet identification (step 820).

The user then inputs data from the module 190 into the program of instruction 122. This may be accomplished by manually entering data displayed in an indicator 196 of the module 190. Alternatively, the data may be input by RFID, bar code, or other suitable input device as described above. The program of instruction 122 receives the outlet data (step 830). Then, the program of instruction updates the floor plan 126 by inserting the outlet data (step 840).

After the floor plan is updated, the program of instruction determines whether or not there are any additional outlets with modules 190. If so, the program product repeats steps 814 through 840 for the next outlet with a module 190. If not the program of instruction ends with a floor plan 126 and breaker box representation 124 that identify the various circuits that have been mapped and provide data for each mapped outlet.

According to an alternative exemplary embodiment, the modules 190 have a global positioning satellite system (GPS) 198 embedded in them and the data collection process is automated using the GPS 198. In this embodiment, each module may have a unique identification, such as a serial number and may transmit its location and data.

The invention can take the form of an entirely hardware embodiment, an entirely software embodiment or an embodiment containing both hardware and software elements. In an exemplary embodiment, the invention is implemented in software, which includes but is not limited to firmware, resident software, microcode, etc.

Furthermore, the invention may take the form of a computer program product accessible from a computer-usable or computer-readable medium providing program code for use by or in connection with a computer or any instruction execution system or device. For the purposes of this description, a computer-usable or computer readable medium may be any apparatus that can contain, store, communicate, propagate, or transport the program for use by or in connection with the instruction execution system, apparatus, or device.

The foregoing method may be realized by a program product comprising a machine-readable media having a machine-executable program of instructions, which when executed by a machine, such as a computer, performs the steps of the method. This program product may be stored on any of a variety of known machine-readable media, including but not limited to compact discs, floppy discs, USB memory devices, and the like. Moreover, the program product may be in the form of a machine readable transmission such as blue ray, HTML, XML, or the like.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk an optical disk. Current examples of optical disks include compact disk-read only memory (CD-ROM), compact disk-read/write (CD-R/W) and DVD.

The preceding description and accompanying drawing are intended to be illustrative and not limiting of the invention. The scope of the invention is intended to encompass equivalent variations and configurations to the full extent of the following claims.

What is claimed is:

1. A method for mapping outlets, the method comprising:
   identifying multiple detectors, where each detector is installed in one of a plurality of outlets to be mapped;
   triggering a probe to propagate a signal at one of a plurality of circuit interrupts, where the signal provides circuit information, and where the signal is detectable by any of the detectors connected by a circuit to the one circuit interrupt from which the signal is propagated; and
   retrieving the circuit information, via the probe, from one or more detectors that detected the signal as an indication that the one or more detectors from which the circuit information is retrieved are connected to the circuit.

2. The method of claim 1, further comprising associating the circuit information from each detector that detected the signal with a corresponding outlet on an electronic record of one or more rooms that depict the plurality of outlets to be mapped.

3. The method of claim 1, where the triggering is repeated for one or more additional circuits.

4. The method of claim 1, where the retrieving comprises selecting a detector corresponding to an outlet on an electronic record of one or more rooms and retrieving the circuit information from the detector corresponding to the outlet using an RFID receiver.

5. The method of claim 1, where the circuit information comprises a circuit identifier and is embedded in the signal.

6. The method of claim 1, where the circuit information comprises one or more characteristics of the circuit obtained from measurements made by one of the detectors.

7. The method of claim 6, where the circuit information further comprises one or more characteristics of the circuit obtained from a circuit box diagram.

8. A system for mapping outlets, comprising:
   a probe; and
   a computer operably associated with the probe and programmed to:
      trigger the probe to propagate a signal at one of a plurality of circuit interrupts, where the signal provides circuit information, where each detector of a plurality of detectors is installed in one of a plurality of outlets to be mapped, and where the signal is detectable by any of the plurality of detectors connected by a circuit to the one circuit interrupt from which the signal is propagated; and retrieve the circuit information, via the probe, from one or more detectors that detected the signal as an indication that the one or more detectors from which the circuit information is retrieved are connected to the circuit.

9. The system of claim 8, where the computer is further programmed to associate the circuit information from each detector that detected the signal with a corresponding outlet on an electronic record of one or more rooms that depict the plurality of outlets to be mapped.

10. The system of claim 8, where the computer is further programmed to repeat the triggering of the probe for one or more additional circuits.

11. The system of claim 8, where in being programmed to retrieve the circuit information, the computer is programmed to select a detector corresponding to an outlet on an electronic record of one or more rooms and retrieve the circuit information from the detector corresponding to the outlet using an RFID receiver.

12. The system of claim 8, where the circuit information comprises a circuit identifier and is embedded in the signal.

13. The system of claim 12, where the circuit information comprises one or more characteristics of the circuit obtained from measurements made by one of the detectors, and the circuit information further comprises one or more characteristics of the circuit obtained from a circuit box diagram.

14. A program product comprising a computer readable hardware storage device having encoded thereon a computer executable program of instructions comprising:

first program instructions that trigger a probe to propagate a signal at one of a plurality of circuit interrupts, where the signal provides circuit information, where each detector of a plurality of detectors is installed in one of a plurality of outlets to be mapped, and where the signal is detectable by any of the plurality of detectors connected by a circuit to the one circuit interrupt from which the signal is propagated; and second program instructions that retrieve the circuit information, via the probe, from one or more detectors that detected the signal as an indication that the one or more detectors from which the circuit information is retrieved are connected to the circuit.

15. The program product of claim 14, further comprising third program instructions that associate the circuit information from each detector that detected the signal with a corresponding outlet on an electronic record of one or more rooms that depict the plurality of outlets to be mapped.

16. The program product of claim 14, where the first program instructions that trigger the probe further comprise additional program instructions that repeat the triggering of the probe for one or more additional circuits.

17. The program product of claim 14, where second program instructions that retrieve the circuit information comprise additional program instructions that select a detector corresponding to an outlet on an electronic record of one or more rooms and retrieve the circuit information from the detector corresponding to the outlet using an RFID receiver.

18. The program product of claim 14, where the circuit information comprises a circuit identifier and is embedded in the signal.

19. The program product of claim 14, where the circuit information comprises one or more characteristics of the circuit obtained from measurements made by one of the detectors.

20. The program product of claim 19, where the circuit information further comprises one or more characteristics of the circuit obtained from a circuit box diagram.

* * * * *